US010393974B1

(12) United States Patent
Lei et al.

(10) Patent No.: US 10,393,974 B1
(45) Date of Patent: Aug. 27, 2019

(54) 4-CHANNEL PARALLEL-OPTICAL DEVICE FOR MONITORING EMISSION POWER AND MONITORING METHOD THEREOF

(71) Applicant: O-NET COMMUNICATIONS (SHENZHEN) LIMITED, Shenzhen (CN)

(72) Inventors: Jiangqing Lei, Shenzhen (CN); Tengfei Zhu, Shenzhen (CN); Yanyong Wang, Shenzhen (CN)

(73) Assignee: O-NET COMMUNICATIONS (SHENZHEN) LIMITED, Shenzhen (CN)

( * ) Notice: Subject to any disclaimer, the term of this patent is extended or adjusted under 35 U.S.C. 154(b) by 0 days.

(21) Appl. No.: 16/207,220

(22) Filed: Dec. 3, 2018

Related U.S. Application Data

(63) Continuation of application No. PCT/CN2018/101795, filed on Aug. 22, 2018.

(30) Foreign Application Priority Data

Mar. 30, 2018 (CN) .......................... 2018 1 0276704

(51) Int. Cl.
*G02B 6/42* (2006.01)

(52) U.S. Cl.
CPC ......... *G02B 6/4286* (2013.01); *G02B 6/4214* (2013.01); *G02B 6/4295* (2013.01)

(58) Field of Classification Search
CPC .................................................... G02B 6/4286
USPC ............................................................ 385/33
See application file for complete search history.

(56) References Cited

U.S. PATENT DOCUMENTS

| | | | | |
|---|---|---|---|---|
| 6,172,356 B1 * | 1/2001 | Ogura | H04N 1/02835 250/227.11 |
| 6,243,516 B1 * | 6/2001 | Seino | G02B 6/125 385/14 |
| 7,013,055 B2 * | 3/2006 | Hayamizu | G02B 6/12007 385/131 |
| 7,174,081 B2 * | 2/2007 | Hayamizu | G02B 6/12007 385/131 |
| 7,324,723 B2 * | 1/2008 | Shioda | G02B 6/122 385/129 |
| 7,747,115 B2 * | 6/2010 | Ohtsu | G02B 6/2817 385/15 |
| 2004/0184702 A1 * | 9/2004 | Hayamizu | G02B 6/12007 385/14 |

(Continued)

*Primary Examiner* — Sung H Pak

(57) ABSTRACT

A 4-channel parallel-optical (SR4) device for monitoring an emission power includes an emission assembly, a receiving assembly, and a monitoring assembly. The emission assembly includes an emission chip, a first planar groove, and a second planner groove. The receiving assembly includes a third planar groove and a receiving chip. The emission chip emits the laser to the first planar groove, the first planar groove transmits a part of the laser to the second planar groove, and the second planar groove total reflects the transmitted laser to an optical fiber. The first planar groove reflects a part of the laser to the monitoring assembly. The monitoring assembly receives the reflected laser and monitors power parameters of the reflected laser, the laser is emitted to the third planar groove through the optical fiber, the third planar groove total reflects the laser to the receiving chip, and the receiving chip receives the laser.

18 Claims, 4 Drawing Sheets

(56) References Cited

U.S. PATENT DOCUMENTS

| | | | | |
|---|---|---|---|---|
| 2004/0247231 | A1* | 12/2004 | Lee | G02B 6/12007 385/14 |
| 2005/0265663 | A1* | 12/2005 | Maruyama | G02B 6/4206 385/47 |
| 2006/0104587 | A1* | 5/2006 | Hayamizu | G02B 6/12007 385/129 |
| 2006/0110098 | A1* | 5/2006 | Hayamizu | G02B 6/12007 385/14 |
| 2012/0063721 | A1* | 3/2012 | Chen | H04B 10/564 385/33 |
| 2019/0079225 | A1* | 3/2019 | Wu | G02B 5/201 |

* cited by examiner

4-CHANNEL PARALLEL-OPTICAL DEVICE FOR MONITORING EMISSION POWER AND MONITORING METHOD THEREOF

CROSS-REFERENCE TO RELATED APPLICATIONS

This is a continuation-application of International Application No. PCT/CN2018/101795, with an international filing date of Aug. 22, 2018, which claims foreign priority to Chinese Patent Application No. 201810276704.X, filed on Mar. 30, 2018 in the State Intellectual Property Office of China, the contents of all of which are hereby incorporated by reference.

TECHNICAL FIELD

The present disclosure relates to the technical field of optical transceiver devices, and in particular to a 4-channel parallel-optical (SR4) device for monitoring an emission power and a monitoring method thereof.

BACKGROUND

At present, compared to spectrum efficiency and distance-bit rate product in long-distance network for people, in an inner network of large-throughput data center and optical fiber connected to a server that is only a few meters to several kilometers, people are more concerned with interconnection of stations with high-speed and short-distance optical fiber module.

However, a conventional 4-channel parallel-optical module for short reach optical links usually uses that four transceiver chips is integrated on a printed circuit board, a single-channel rate is 25 Gbps, namely total rate is up to 100 Gbps.

A 4-channel parallel-optical (SR4) device monitors optical power of transmitting terminal in use. An existing method is a splitting method that beam splitting prism directs signal of emission light source to a monitoring chip, which increases difficulty of device processing and surface coating process.

SUMMARY

The technical problem solved by the present disclosure is to provide a 4-channel parallel-optical (SR4) device for monitoring emission power capable of monitoring emission power of emission chip.

The technical problem solved by the present disclosure is to provide a monitoring method capable of monitoring an emission power of emission chip.

In order to solve the technical problem mentioned above, the present disclosure provides a 4-channel parallel-optical (SR4) device for monitoring emission power, comprising: an emission assembly for emitting laser, a receiving assembly for receiving the laser, and a monitoring assembly for monitoring the emission power of the emission assembly. The emission assembly comprises an emission chip, a first planar groove for reflecting and transmitting the laser, and a second planner groove for total reflecting the laser; the receiving assembly comprises a third planar groove for total reflecting the laser and a receiving chip. An inner angle of the first planar groove is 12°.

The emission chip emits the laser to the first planar groove, the first planar groove transmits a part of the laser to the second planar groove, and the second planar groove total reflects the transmitted laser to an optical fiber. The first planar groove reflects a part of the laser to the monitoring assembly. The monitoring assembly receives the reflected laser and monitors power parameters of the reflected laser, the laser is emitted to the third planar groove through the optical fiber, the third planar groove total reflects the laser to the receiving chip, and the receiving chip receives the laser.

Furthermore, the emission assembly further comprises a first collimating lens for collimating the laser, where the first collimating lens is arranged adjacent to the emission chip.

Furthermore, the emission assembly further comprises a first focusing lens for focusing the laser, where the first focusing laser is arranged adjacent to the optical fiber.

Furthermore, the emission assembly further comprises a fourth planar groove. The fourth planar groove and the first planar groove are horizontally arranged. An inner angle of the fourth planar groove is 12°.

Furthermore, the receiving assembly further comprises a fifth planar groove for reflecting and transmitting the laser, where the fifth planar groove is arranged between the third planar groove and the receiving chip. An inner angle of the fifth planar groove is 12°.

Furthermore, the receiving assembly further comprises a second collimating lens for collimating the laser, where the second collimating lens is arranged adjacent to the optical fiber.

Furthermore, the receiving assembly further comprises a second focusing lens for focusing the laser, the second focusing lens is arranged adjacent to the receiving chip.

Furthermore, the emission assembly further comprises a sixth planar groove; the fifth planar groove and the sixth planar groove are horizontally arranged, and an inner angle of the sixth planar groove is 12°.

Furthermore, an inner angle of the second planner groove and the third planner groove is 45°.

The present disclosure further provides a monitoring method for above 4-channel parallel-optical (SR4) device, the SR4 device comprises an emission assembly for emitting laser, a receiving assembly for receiving the laser, and a monitoring assembly for monitoring the emission power of the emission assembly; the emission assembly comprises an emission chip, a first planar groove for reflecting and transmitting the laser, and a second planner groove for total reflecting the laser; the receiving assembly comprises a third planar groove for total reflecting the laser and a receiving chip; an inner angle of the first planar groove is a predetermined angle; the monitoring method comprises:

emitting laser, by the emission chip, to the first planar groove;

transmitting a part of the laser, by the first planar groove, to the second planar groove, and reflecting a part of the laser to the monitoring assembly;

total reflecting the transmitted laser, by the second planar groove, to the optical fiber;

receiving the reflected laser and monitoring power parameters of the reflected laser by the monitoring assembly;

emitting the laser to the third planar groove through the optical fiber;

total reflecting the laser, by the third planar groove, to the receiving chip; and receiving the laser by the receiving chip.

Furthermore, the emission assembly further comprises a first collimating lens for collimating the laser, where the first collimating lens is arranged adjacent to the emission chip.

Furthermore, the emission assembly further comprises a first focusing lens for focusing the laser, where the first focusing laser is arranged adjacent to the optical fiber.

Furthermore, the emission assembly further comprises a fourth planar groove, where an inner angle of the fourth planar groove is consistent with the inner angle of the first planar groove, and the fourth planar groove and the first planar groove are horizontally arranged.

Furthermore, the receiving assembly further comprises a fifth planar groove for reflecting and transmitting the laser; the fifth planar groove is arranged between the third planar groove and the receiving chip, and an inner angle of the fifth planar groove is 12°.

Furthermore, the receiving assembly further comprises a second collimating lens for collimating the laser, the second collimating lens is arranged adjacent to the optical fiber.

Furthermore, the receiving assembly further comprises a second focusing lens for focusing the laser, the second focusing lens is arranged adjacent to the receiving chip.

Furthermore, the emission assembly further comprises a sixth planar groove; the fifth planar groove and the sixth planar groove are horizontally arranged, and an inner angle of the sixth planar groove is 12°.

Furthermore, an inner angle of the second planner groove and the third planner groove is 45°.

The benefit effects of the present disclosure are: different from the prior art, the present disclosure provides the SR4 device for monitoring emission power and a monitoring method, the laser is emitted, and the laser is reflected by the first planar groove. The laser is focused and emitted to the monitoring chip, and the monitoring chip directly monitors power parameters of the emitted laser through receiving reflected signal, which is without device processing and surface coating process, and the cost is reduced. The present disclosure uses a plurality of collimating lens and focusing lens to make the laser successfully transmit in the SR4 device.

BRIEF DESCRIPTION OF THE DRAWINGS

The present disclosure will be further described with reference to the accompanying drawings and embodiments.

DETAILED DESCRIPTION

The following will clearly and completely describe the technical solutions in the embodiments of the present disclosure with reference to the accompanying drawings in the embodiments of the present disclosure.

Figure 1:
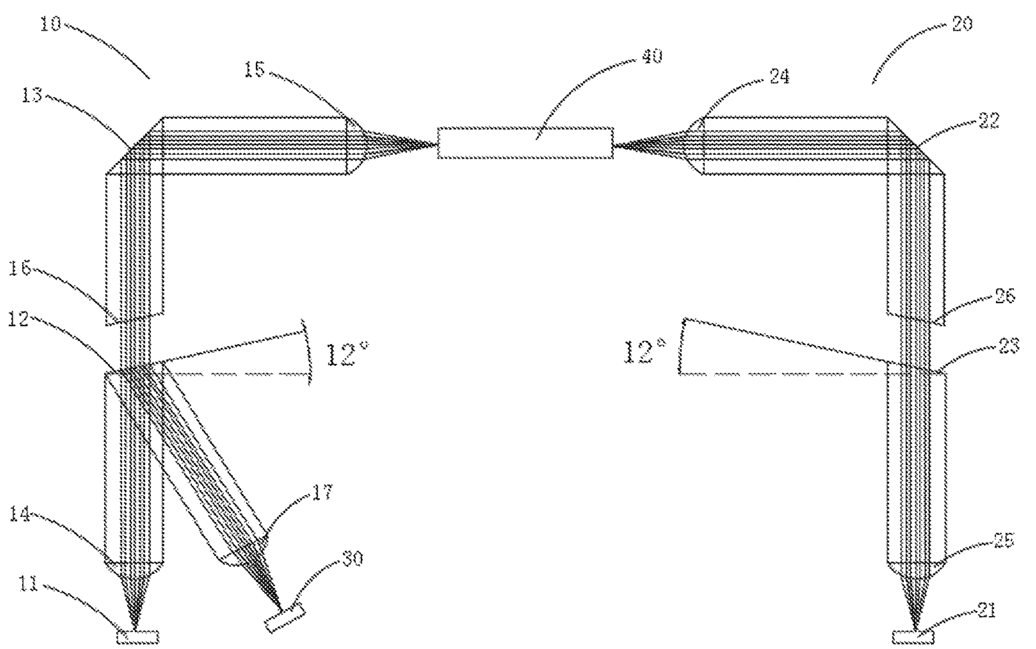
FIG. 1 is a schematic diagram of a 4-channel parallel-optical (SR4) device of the present disclosure.
Figure 2:
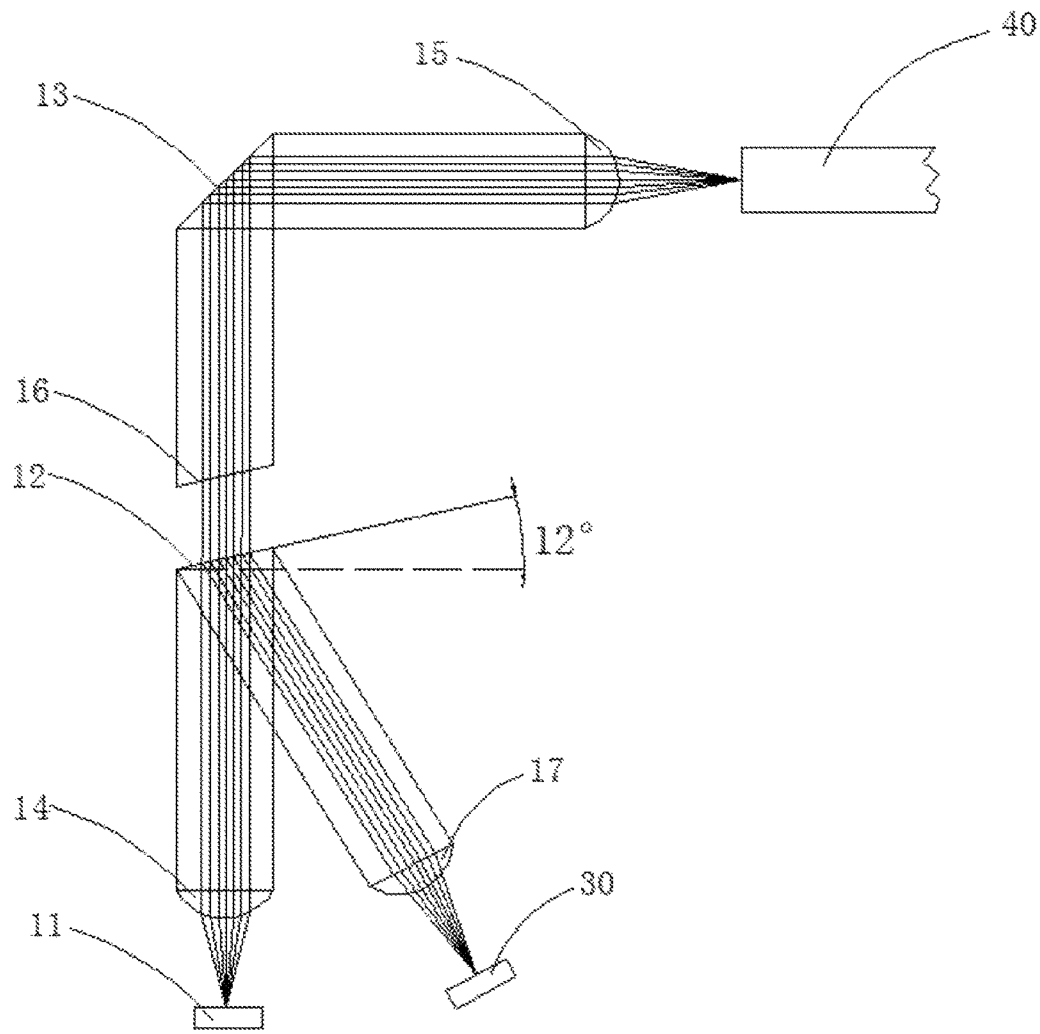
FIG. 2 is a schematic diagram of an emission assembly of the present disclosure.
Figure 3:
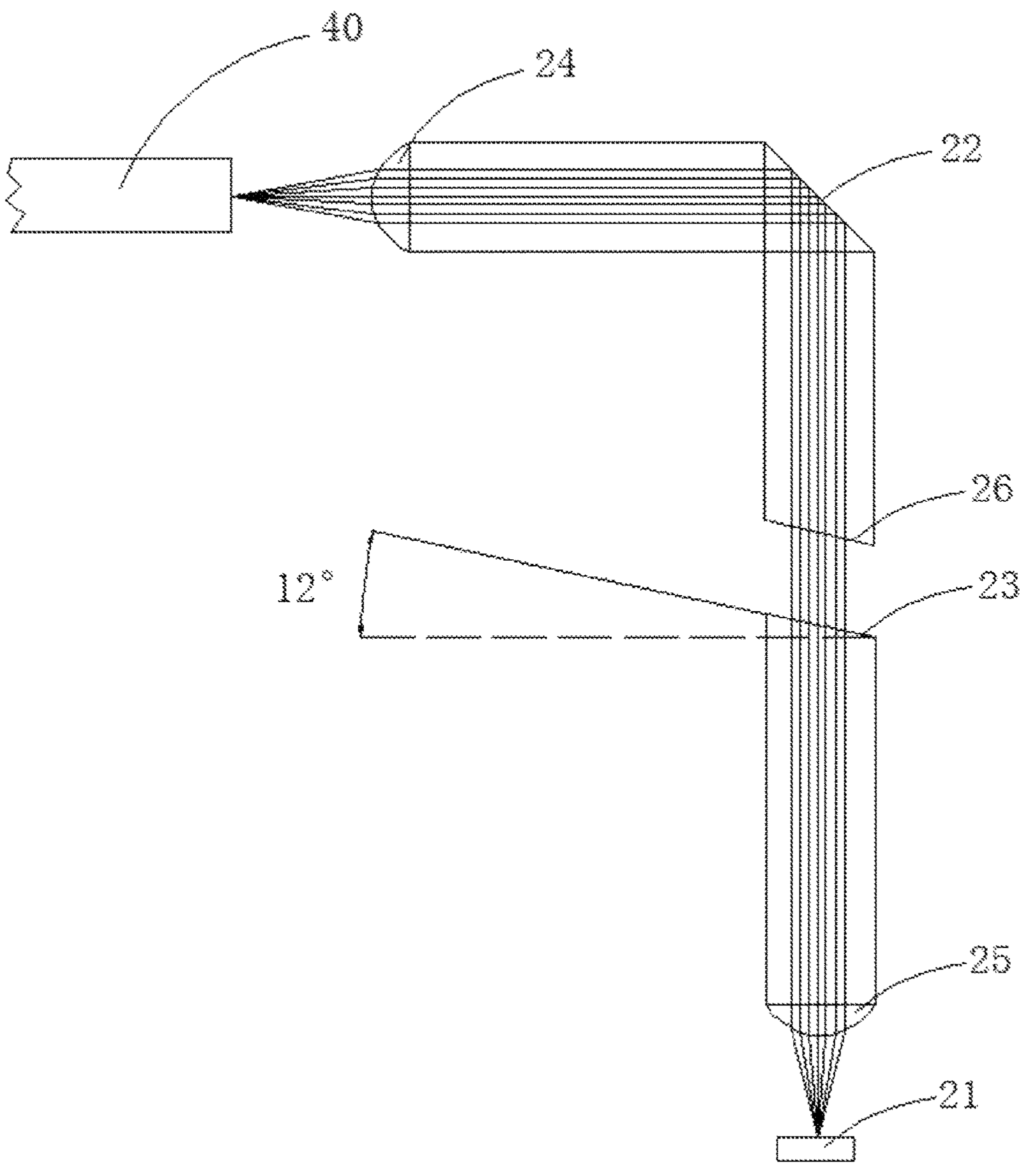
FIG. 3 is a schematic diagram of a receiving assembly of the present disclosure.

As shown in FIG. 1 to FIG. 3, the present disclosure provides an embodiment of a 4-channel parallel-optical (SR4) device for monitoring emission power.

To be specific, as shown in FIG. 1, the SR4 device for monitoring an emission power comprises an emission assembly 10 for emitting laser, a receiving assembly 20 for receiving the laser, and a monitoring assembly 30 for monitoring the emission power of the emission assembly 10, where the monitoring assembly 30 is a monitoring chip. The emission assembly 10 is used to emit the laser to the receiving assembly 20, the receiving assembly 20 receives the laser, and the monitoring assembly 30 monitors a power of the emitted laser of the emission assembly 10 in real-time.

As shown in FIG. 2, the emission assembly 10 comprises an emission chip 11, a first planar groove 12 for reflecting and transmitting the laser, a second planner groove 13 for total reflecting the laser, a first collimating lens 14 for collimating the laser, a first focusing lens 15 for focusing the laser, and a fourth planar groove 16 for transmitting the laser. An inner angle of the first planar groove 12 is set to a predetermined angle, which is related to a position of the monitoring assembly 30. Furthermore, the inner angle of the first planar groove 12 is set to be 12°, an inner angle of the fourth planar groove 16 is consistent with the inner angle of the first planar groove 12, and the fourth planar groove 16 and the first planar groove 12 are horizontally arranged. An inner angle of the fourth planar groove 16 is 12°. An inner angle of the second planner groove 13 is 45°. The first collimating lens 14 is arranged adjacent to the emission chip 11. Along with transmitting of an optical path, the first planar groove 12 is arranged behind the first collimating lens 14, the fourth planar groove 16 is arranged adjacent to the first planar groove 12, the second planner groove 13 is arranged behind the fourth planar groove 16, the first focusing laser 15 is arranged adjacent to optical fiber 40 and behind the second planner groove 13. The emission assembly 10 further comprises a third focusing lens 17 for focusing the laser, where the third focusing lens 17 is arranged adjacent to the monitoring assembly 30.

As shown in FIG. 3, the receiving assembly 20 comprises a third planar groove 22 for total reflecting the laser, a receiving chip 21, a fifth planar groove 26 for reflecting and transmitting the laser, a second collimating lens 24 for collimating the laser, a second focusing lens 25 for focusing the laser, and a sixth planar groove 23 for transmitting the laser. An inner angle of the fifth planar groove 26 is set to be 12°. The fifth planar groove 26 and the sixth planar groove 23 are horizontally arranged. An inner angle of the sixth planar groove 23 is 12°, and an inner angle of the third planner groove 22 is 45°. The second collimating lens 24 is arranged adjacent to the optical fiber 40. Along with transmitting of the optical path, the third planar groove 22 is arranged behind the second collimating lens 24, and the fifth planar groove 26 is arranged between the third planar groove 22 and the receiving chip 21. To be specific, the fifth planar groove 26 is arranged behind the third planar groove 22. Along with transmitting of the optical path, the second focusing laser 25 is arranged behind the sixth planner groove 23 and is arranged adjacent to the receiving chip 21. It should be understood that the fifth planar groove 26 and the sixth planar groove 23 also can be horizontal planar groove to make the laser passing through the fifth planar groove 26 and the sixth planar groove 23 vertically emits to the receiving chip 21, which is not limited.

The transmission of the optical path of the emission assembly is as follow: the transmission chip 11 emits the laser outward, the laser is collimated by the first collimating lens 14 and is transmitted to the first planar groove 12, the first planar groove 12 transmits a part of the laser to the fourth planar groove 16, and the laser is transmitted to the second planar groove 13. The second planar groove 13 total reflects the laser to the first focusing lens 15. The first focusing lens 15 focuses the laser on the optical fiber 40. The first planar groove 12 reflects a part of the laser to the third focusing lens 17, and the laser is focused by the third focusing lens 17 and is transmitted to the monitoring assembly 30. The monitoring assembly 30 receives the reflected laser and monitors power parameters of the reflected laser to directly monitor power parameters of the emitted laser.

The transmission of the optical path of the receiving assembly 20 is as follow: the laser is emitted to the second collimating lens 24 through the optical fiber 40, and the laser is collimated by the second collimating lens 24 and emits to the third planar groove 22; the third planar groove 22 total reflects the laser to the fifth planar groove 26, the fifth planar groove 26 transmits a part of the laser or all laser to the sixth planar groove 23, along with the transmission of the optical path, the laser is transmitted to the second focusing lens 25, and the laser is focused by the second focusing lens 25 and is transmitted to the receiving chip 21. The receiving chip 21 receives the laser.

Figure 4:
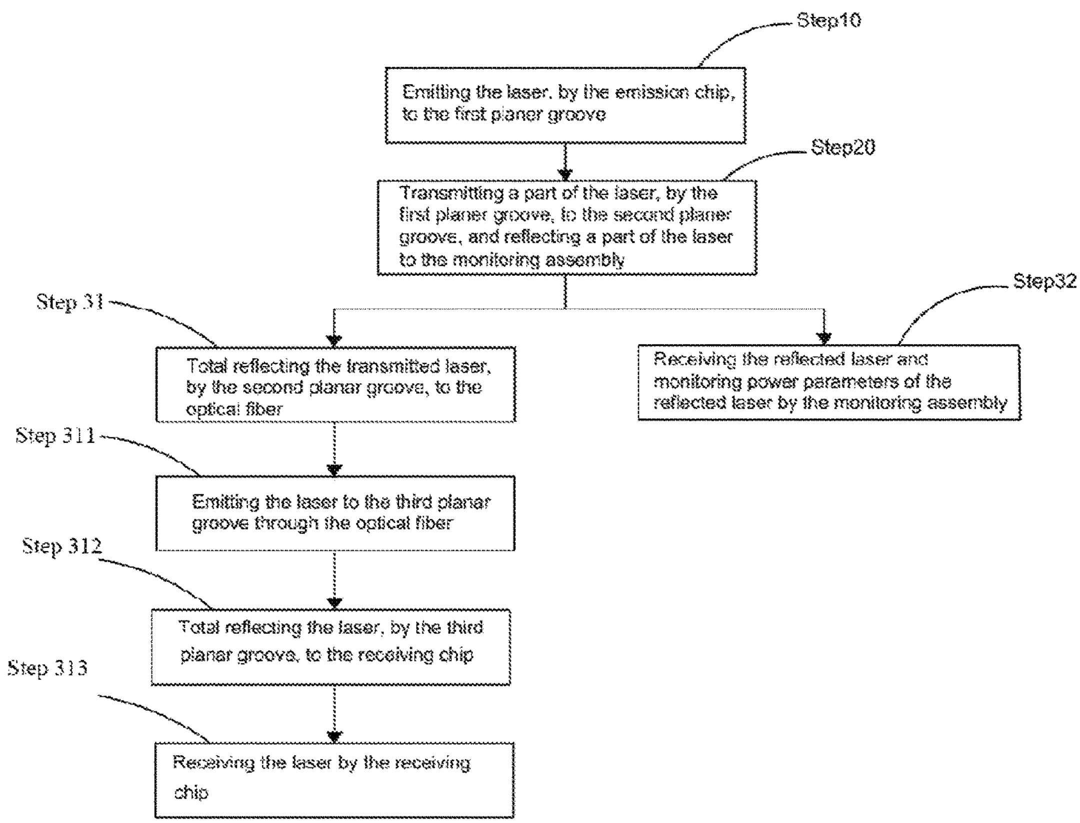
FIG. 4 is a flowchart diagram of a monitoring method of the present disclosure.

As shown in FIG. 4, the present disclosure further provides a preferred embodiment of a monitoring method.

To be specific, as shown in FIG. 4, the monitoring method applied on the above SR4 device, the SR4 device comprises the emission assembly 10 for emitting laser, the receiving assembly 20 for receiving the laser, and the monitoring assembly 30 for monitoring the emission power of the emission assembly, the emission assembly comprises the emission chip 11, the first planar groove 12 for reflecting and transmitting the laser, and the second planner groove 13 for total reflecting the laser; the receiving assembly 20 comprises the third planar groove 22 for total reflecting the laser and the receiving chip 21; the inner angle of the first planar groove is the predetermined angle; the monitoring method comprising:

Step10: emitting the laser, by the emission chip, to the first planar groove;

Step20: transmitting a part of the laser, by the first planar groove, to the second planar groove, and reflecting a part of the laser to the monitoring assembly;

Step31: total reflecting the transmitted laser, by the second planar groove, to the optical fiber;

Step32: receiving the reflected laser and monitoring power parameters of the reflected laser by the monitoring assembly;

Step311: emitting the laser to the third planar groove through the optical fiber;

Step312: total reflecting the laser, by the third planar groove, to the receiving chip;

Step313: receiving the laser by the receiving chip.

Furthermore, the emission assembly 10 further comprises the first collimating lens 14 for collimating the laser; the first collimating lens 14 is arranged adjacent to the emission chip 11. The emission assembly 10 further comprises the first focusing lens 15 for focusing the laser, where the first focusing laser 15 is arranged adjacent to the optical fiber 40. The emission assembly 10 further comprises the fourth planar groove 16, the inner angle of the fourth planar groove 16 is consistent with the inner angle of the first planar groove 12, and the fourth planar groove 16 and the first planar groove 12 are horizontally arranged.

The receiving assembly 20 further comprises the fifth planar groove 26 for reflecting and transmitting the laser, where the fifth planar groove 26 is arranged between the third planar groove 22 and the receiving chip 21, and the inner angle of the fifth planar groove is 12°. The receiving assembly 20 further comprises the second collimating lens 24 for collimating the laser, where the second collimating lens 24 is arranged adjacent to the optical fiber 40. The receiving assembly 20 further comprises the second focusing lens 25 for focusing the laser, where the second focusing lens 25 is arranged adjacent to the receiving chip 21.

The emission assembly 10 further comprises the sixth planar groove 23, where the fifth planar groove 26 and the sixth planar groove 23 are horizontally arranged, and the inner angle of the sixth planar groove is 12°. The inner angle of the second planner groove 13 and the third planner groove 22 is 45°.

The foregoing descriptions are merely implementation manners of the present disclosure, and therefore do not limit the scope of patents of the present disclosure. Any equivalent structure or equivalent process transformation using the description of the present disclosure and the accompanying drawings may be directly or indirectly applied to other related technologies. The same applies in the field of patent protection of this disclosure.

What is claimed is:

1. A 4-channel parallel-optical (SR4) device for monitoring an emission power, comprising:

an emission assembly for emitting laser, a receiving assembly for receiving the laser, and a monitoring assembly for monitoring the emission power of the emission assembly, wherein the emission assembly comprises an emission chip, a first planar groove for reflecting and transmitting the laser, and a second planner groove for total reflecting the laser; the receiving assembly comprises a third planar groove for total reflecting the laser and a receiving chip; an inner angle of the first planar groove is a predetermined angle;

wherein the emission chip emits the laser to the first planar groove, the first planar groove transmits a part of the laser to the second planar groove, and the second planar groove total reflects the transmitted laser to an optical fiber; the first planar groove reflects a part of the laser to the monitoring assembly; the monitoring assembly receives the reflected laser and monitors power parameters of the reflected laser; the laser is emitted to the third planar groove through the optical fiber, the third planar groove total reflects the laser to the receiving chip, and the receiving chip receives the laser.

2. The SR4 device according to claim 1, wherein the emission assembly further comprises a first collimating lens for collimating the laser; the first collimating lens is arranged adjacent to the emission chip.

3. The SR4 device according to claim 2, wherein the emission assembly further comprises a first focusing lens for focusing the laser; the first focusing laser is arranged adjacent to the optical fiber.

4. The SR4 device according to claim 1, wherein the emission assembly further comprises a fourth planar groove; the first focusing laser is arranged adjacent to the optical fiber; an inner angle of the fourth planar groove is consistent with the inner angle of the first planar groove, and the fourth planar groove and the first planar groove are horizontally arranged.

5. The SR4 device according to claim 1, wherein the receiving assembly further comprises a fifth planar groove for reflecting and transmitting the laser, the fifth planar groove is arranged between the third planar groove and the receiving chip, and an inner angle of the fifth planar groove is 12°.

6. The SR4 device according to claim 5, wherein the receiving assembly further comprises a second collimating lens for collimating the laser; the second collimating lens is arranged adjacent to the optical fiber.

7. The SR4 device according to claim 6, wherein the receiving assembly further comprises a second focusing lens for focusing the laser; the second focusing lens is arranged adjacent to the receiving chip.

8. The SR4 device according to claim 5, wherein the emission assembly further comprises a sixth planar groove; the fifth planar groove and the sixth planar groove are horizontally arranged, and an inner angle of the sixth planar groove is 12°.

9. The SR4 device according to claim 1, wherein an inner angle of the second planner groove and the third planner groove is 45°.

10. A monitoring method applied on a 4-channel parallel-optical (SR4) device, the SR4 device comprises an emission assembly for emitting laser, a receiving assembly for receiving the laser, and a monitoring assembly for monitoring the emission power of the emission assembly; the emission assembly comprises an emission chip, a first planar groove for reflecting and transmitting the laser, and a second planner groove for total reflecting the laser; the receiving assembly comprises a third planar groove for total reflecting the laser and a receiving chip; an inner angle of the first planar groove is a predetermined angle; the monitoring method, comprising:

emitting laser, by the emission chip, to the first planar groove;

transmitting a part of the laser, by the first planar groove, to the second planar groove, and reflecting a part of the laser to the monitoring assembly;

total reflecting the transmitted laser, by the second planar groove, to the optical fiber;

receiving the reflected laser and monitoring power parameters of the reflected laser by the monitoring assembly;

emitting the laser to the third planar groove through the optical fiber;

total reflecting the laser, by the third planar groove, to a receiving chip; and receiving the laser by the receiving chip.

11. The monitoring method device according to claim 10, wherein the emission assembly further comprises a first collimating lens for collimating the laser: the first collimating lens is arranged adjacent to the emission chip.

12. The monitoring method device according to claim 11, wherein the emission assembly further comprises a first focusing lens for focusing the laser: the first focusing laser is arranged adjacent to the optical fiber.

13. The monitoring method device according to claim 10, wherein the emission assembly further comprises a fourth planar groove; an inner angle of the fourth planar groove is consistent with the inner angle of the first planar groove, and the fourth planar groove and the first planar groove are horizontally arranged.

14. The monitoring method device according to claim 10, wherein the receiving assembly further comprises a fifth planar groove for reflecting and transmitting the laser; the fifth planar groove is arranged between the third planar groove and the receiving chip, and an inner angle of the fifth planar groove is 12°.

15. The monitoring method device according to claim 14, wherein the receiving assembly further comprises a second collimating lens for collimating the laser; the second collimating lens is arranged adjacent to the optical fiber.

16. The monitoring method device according to claim 15, wherein the receiving assembly further comprises a second focusing lens for focusing the laser; the second focusing lens is arranged adjacent to the receiving chip.

17. The monitoring method device according to claim 14, wherein the emission assembly further comprises a sixth planar groove; the fifth planar groove and the sixth planar groove are horizontally arranged, and an inner angle of the sixth planar groove is 12°.

18. The monitoring method device according to claim 10, wherein an inner angle of the second planner groove and the third planner groove is 45°.

* * * * *